United States Patent
Kwon et al.

(10) Patent No.: US 10,692,935 B2
(45) Date of Patent: Jun. 23, 2020

(54) 3D STATIC RAM CORE CELL HAVING VERTICALLY STACKED STRUCTURE, AND STATIC RAM CORE CELL ASSEMBLY COMPRISING SAME

(71) Applicant: CENTER FOR ADVANCED SOFT ELECTRONICS, Pohang-si (KR)

(72) Inventors: Jimin Kwon, Paju-si (KR); Sungjune Jung, Pohang-si (KR); Jae Joon Kim, Pohang-si (KR); Kilwon Cho, Pohang (KR); Sujeong Kyung, Gunsan-si (KR)

(73) Assignees: CENTER FOR ADVANCED SOFT ELECTRONICS, Pohang-si (KR); POSTECH ACADEMY-INDUSTRY FOUNDATION, Pohang-si (KR)

( * ) Notice: Subject to any disclaimer, the term of this patent is extended or adjusted under 35 U.S.C. 154(b) by 44 days.

(21) Appl. No.: 16/066,862

(22) PCT Filed: Dec. 28, 2016

(86) PCT No.: PCT/KR2016/015420
§ 371 (c)(1),
(2) Date: Jun. 28, 2018

(87) PCT Pub. No.: WO2017/116143
PCT Pub. Date: Jul. 6, 2017

(65) Prior Publication Data
US 2019/0006424 A1  Jan. 3, 2019

(30) Foreign Application Priority Data
Dec. 29, 2015  (KR) .................. 10-2015-0188828

(51) Int. Cl.
*H01L 27/28* (2006.01)
*H01L 27/11* (2006.01)
(Continued)

(52) U.S. Cl.
CPC .......... *H01L 27/281* (2013.01); *H01L 23/528* (2013.01); *H01L 23/5226* (2013.01);
(Continued)

(58) Field of Classification Search
None
See application file for complete search history.

(56) References Cited

U.S. PATENT DOCUMENTS

| 7,785,938 B2 * | 8/2010 | Yamaguchi | ......... H01L 21/8221 |
|---|---|---|---|
| | | | 257/E23.016 |
| 2007/0254455 A1 * | 11/2007 | Yamaguchi | ......... H01L 21/8221 |
| | | | 438/455 |

FOREIGN PATENT DOCUMENTS

| JP | 2007318106 A | 12/2007 |
|---|---|---|
| KR | 1020080067126 A | 7/2008 |

(Continued)

OTHER PUBLICATIONS

International Search Report of PCT/KR2016/015420; dated Apr. 26, 2017; English translation.

*Primary Examiner* — Telly D Green
(74) *Attorney, Agent, or Firm* — STIP Law Group, LLC

(57) ABSTRACT

Disclosed is a 3D static RAM core cell having a vertically stacked structure, including six thin-film transistors each having a gate electrode, a source electrode and a drain electrode, the static RAM core cell including two switching thin-film transistors, each connected to a bit line and a word line to select recording and reading of data, and four data-storage thin-film transistors connected to a power supply voltage (Vdd) or a ground voltage (Vss) to record and read data, the static RAM core cell including a first transistor layer including two thin-film transistors selected from among the six thin-film transistors, a second transistor layer disposed on the first transistor layer and including two thin-film transistors selected from among the remaining four (Continued)

thin-film transistors, and a third transistor layer disposed on the second transistor layer and including the remaining two thin-film transistors, at least one electrode of the first transistor layer and at least one electrode of the second transistor layer being electrically connected to each other, and at least one electrode of the second transistor layer and at least one electrode of the third transistor layer being electrically connected to each other. Thereby, the static RAM core cell is configured such that organic transistors of the same type are arranged in the same plane and are vertically stacked, thus omitting a complicated patterning process for forming organic transistors of different types upon fabrication of a memory element, and also reducing the area occupied by the memory element to thereby increase the degree of integration of semiconductor circuits.

14 Claims, 3 Drawing Sheets

(51) Int. Cl.
*H01L 23/522* (2006.01)
*H01L 23/528* (2006.01)
*H01L 51/00* (2006.01)
*H01L 51/05* (2006.01)
*H01L 51/10* (2006.01)

(52) U.S. Cl.
CPC ........ *H01L 27/1108* (2013.01); *H01L 27/283* (2013.01); *H01L 51/0035* (2013.01); *H01L 51/0094* (2013.01); *H01L 51/055* (2013.01); *H01L 51/105* (2013.01); *H01L 51/0004* (2013.01); *H01L 51/0022* (2013.01); *H01L 51/052* (2013.01); *H01L 51/0558* (2013.01)

(56) References Cited

FOREIGN PATENT DOCUMENTS

| | | | |
|---|---|---|---|
| KR | 101100426 B1 * | 12/2011 | ............ H01L 21/84 |
| KR | 101100426 B1 | 12/2011 | |
| KR | 101275758 B1 | 6/2013 | |
| WO | WO2014185085 A1 | 11/2014 | |

* cited by examiner

[FIG. 1]
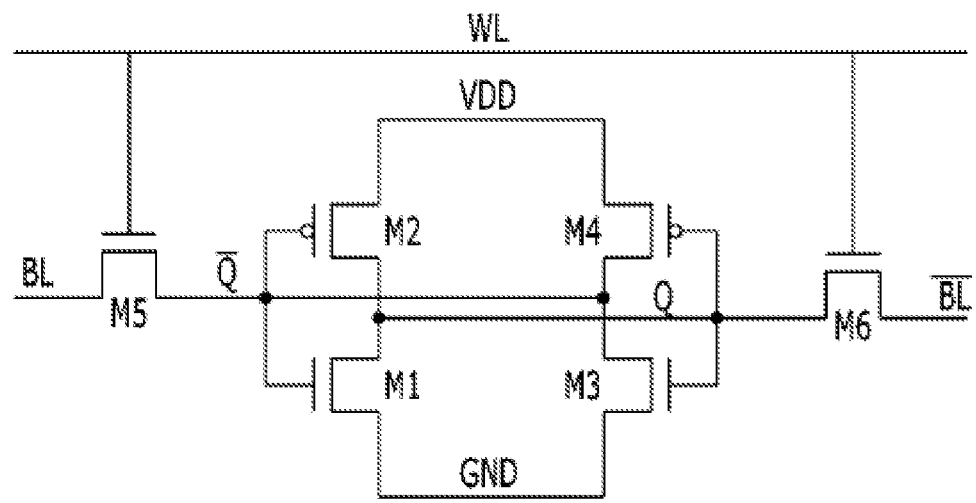
[FIG. 2]
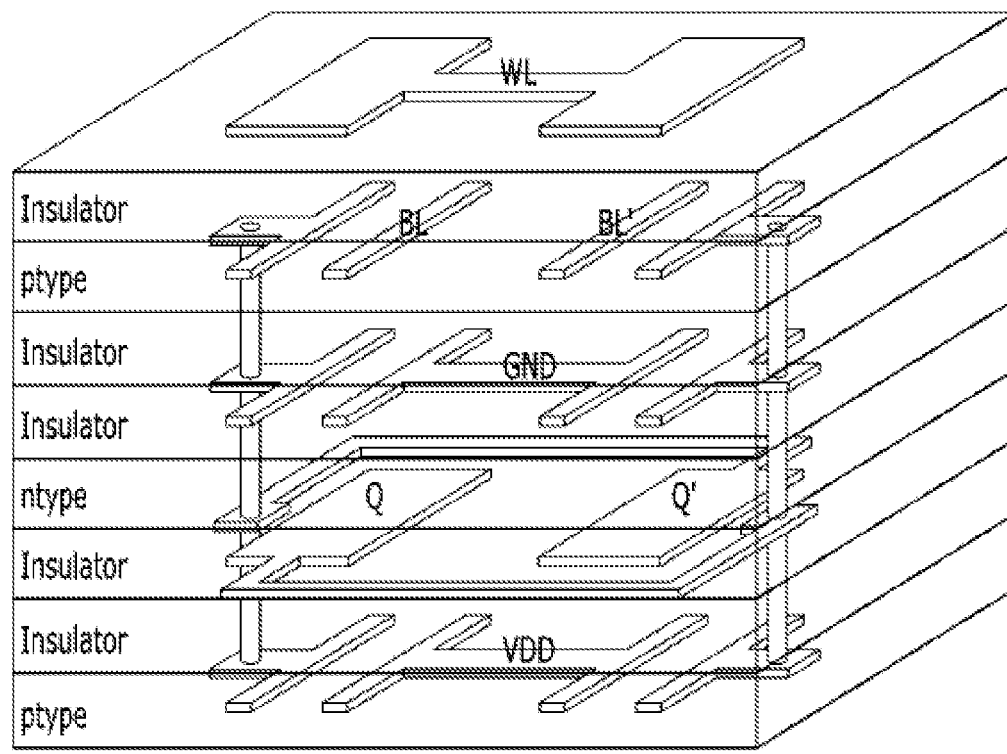

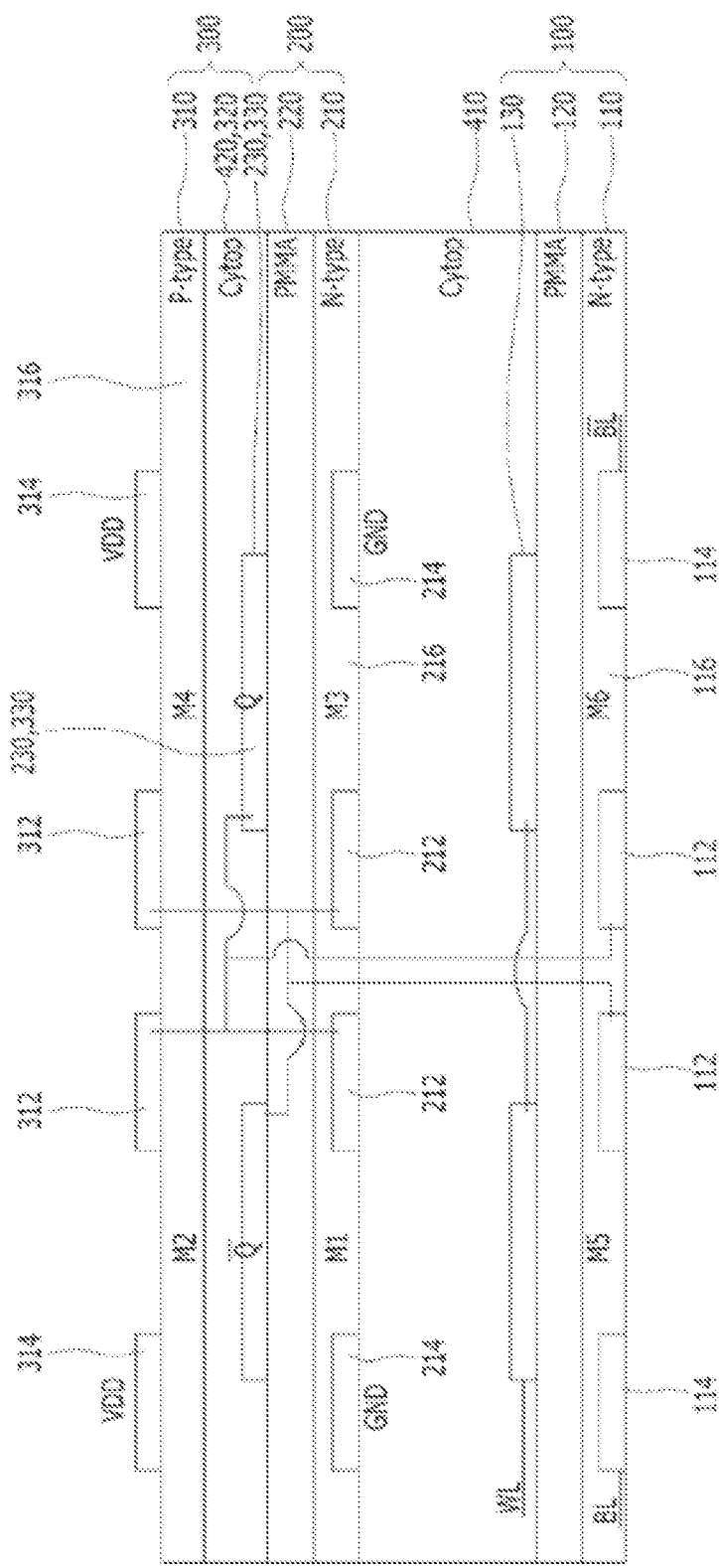
[FIG. 3]

【FIG. 4】
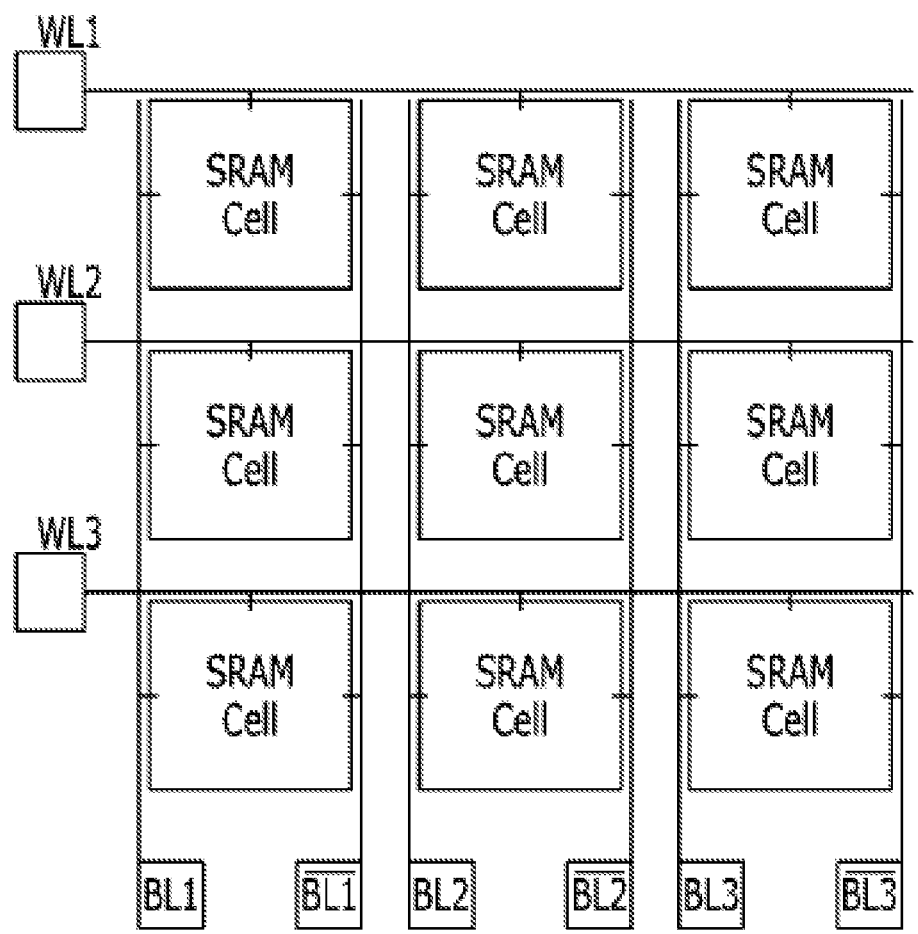

3D STATIC RAM CORE CELL HAVING VERTICALLY STACKED STRUCTURE, AND STATIC RAM CORE CELL ASSEMBLY COMPRISING SAME

CROSS-REFERENCE TO RELATED APPLICATIONS

This application is the U.S. National Phase under 35 U.S.C. § 371 of International Application No. PCT/KR2016/015420 filed on Dec. 28, 2016, which in turn claims the benefit of Korean Application No. 10-2015-0188828, filed on Dec. 29, 2015, the disclosures of which are incorporated by reference into the present application.

TECHNICAL FIELD

The present invention relates to a 3D (three-dimensional) static RAM (Random-Access Memory) core cell having a vertically stacked structure and a static RAM core cell assembly including the same, and more particularly to a 3D static RAM core cell having a vertically stacked structure, configured such that organic transistors of the same type are formed in a single layer and are vertically stacked, and to a static RAM core cell assembly including the same.

BACKGROUND ART

Static RAM or SRAM, which is a kind of semiconductor memory, is able to preserve data therein only as long as power is supplied to a memory, unlike DRAM (dynamic RAM), in which data is periodically renewed. Since SRAM is a kind of random-access memory, the time required to input and output data is constant regardless of the addresses at which data is written and read. SRAM is a memory element that is completely different from SDRAM, which is a kind of DRAM, and thus these should be distinguished from each other. In SRAM, each bit is stored in two pairs of inverters comprising four transistors. Two pairs of inverters keep the values of 0 and 1 stable and two access transistors perform reading and writing functions. Thus, six transistors are typically required to store one bit.

Gordon Moore, the co-founder of Intel, elucidated Moore's Law in 1965, which states that the degree of integration of semiconductor transistors doubles every 18 months. In the decades that followed, the degree of integration of semiconductors has increased in accordance with Moore's Law, but recently, Moore's Law has become inapplicable due to the physical limitations of atomic-scale processing. Therefore, progressively intensive research is ongoing into increasing the degree of integration of semiconductors by vertically stacking semiconductors, rather than merely increasing the degree of integration in a plane.

Meanwhile, a thin-film transistor (TFT) is provided in the form of a thin film, which is a kind of a field-effect transistor (FET). Basically, it is a three-terminal element (no back gate B is present), and is mainly applied to liquid crystal displays.

Also, an organic field-effect transistor (OFET) is a field-effect transistor in which an organic semiconductor technique is used in the transistor channel. The organic field-effect transistor may be manufactured using a vacuum evaporation process on a small molecule or a solution-casting process on a polymer. The organic field-effect transistor has been developed to manufacture large-area electronic products at low cost, and the organic field-effect transistor is manufactured with various device geometries.

Recently developed flexible thin-film transistors based on soft materials have significantly lower electron mobility than silicon semiconductors. For this reason, in order to achieve similar levels of performance to existing silicon-based semiconductor devices, the channels of individual semiconductor devices must be hundreds to tens of thousands of times larger. Moreover, in order to manufacture a memory element, semiconductors of two different types, namely a p-type and an n-type, have to be formed on a single surface and connected to each other, and thus a p-type semiconductor material, an n-type semiconductor material, electrodes and insulating materials suitable for respective types are patterned, which thus complicates processing.

As described above, the related art is problematic in that it is difficult to apply soft materials and processes to memory elements because the number of elements integrated per unit area is very small and the processes are complicated.

DISCLOSURE

Technical Problem

Accordingly, the present invention has been made keeping in mind the problems encountered in the related art, and the present invention is intended to provide a static RAM core cell and a static RAM core cell assembly including the same, in which organic transistors of the same type are arranged in the same plane and are vertically stacked, thus omitting a complicated patterning process for forming organic transistors of different types upon fabrication of a memory element, and also reducing the area occupied by the memory element to thereby increase the degree of integration of semiconductor circuits.

Technical Solution

An aspect of the present invention provides a 3D static RAM core cell having a vertically stacked structure.

The static RAM core cell includes six thin-film transistors each comprising a gate electrode, a source electrode and a drain electrode.

The static RAM core cell includes two switching thin-film transistors, each connected to a bit line and a word line to select recording and reading of data, and four data-storage thin-film transistors connected to a power supply voltage Vdd or a ground voltage Vss to record and read data.

The static RAM core cell includes a first transistor layer including two thin-film transistors selected from among the six thin-film transistors, a second transistor layer disposed on the first transistor layer and including two thin-film transistors selected from among the remaining four thin-film transistors, and a third transistor layer disposed on the second transistor layer and including the remaining two thin-film transistors.

Here, at least one electrode of the first transistor layer and at least one electrode of the second transistor layer are electrically connected to each other, and at least one electrode of the second transistor layer and at least one electrode of the third transistor layer are electrically connected to each other.

Two thin-film transistors among the six thin-film transistors may be any one of an n-type and a p-type, and the remaining four thin-film transistors among the six thin-film transistors may be the remaining one of the n-type and the p-type, two thin-film transistors of the same type among the six thin-film transistors may be included in any one transistor layer (a) among the first transistor layer to the third transistor layer, and two each of the remaining four thin-film transistors of the same type among the six thin-film transistors may be included in the remaining two transistor layers (b) among the first transistor layer to the third transistor layer.

The electrical connection may be performed through a conductive via hole.

A transistor included in one of the two transistor layers (b) and a transistor included in the transistor layer (a) may share the gate electrode with each other.

The first transistor layer may include a first electrode channel film comprising a first source electrode, a first drain electrode and a first organic semiconductor; a first insulating film formed on the first electrode channel film; and a first gate electrode formed on the first insulating film.

The second transistor layer may include a second electrode channel film comprising a second source electrode, a second drain electrode and a second organic semiconductor; a second insulating film formed on the second electrode channel film; and a second gate electrode formed on the second insulating film.

The third transistor layer may include a third electrode channel film comprising a third source electrode, a third drain electrode and a third organic semiconductor; a third insulating film formed on the third electrode channel film; and a third gate electrode formed on the third insulating film.

The first transistor layer may be disposed on a substrate.

A first interlayer insulating film may be further disposed on the first gate electrode, and a second interlayer insulating film may be further disposed on the second gate electrode.

The second interlayer insulating film may be the third insulating film.

At least one of the gate electrode and the source electrode each independently may include at least one selected from among Au, Al, Ag, Be, Bi, Co, Cu, Cr, Hf, In, Mn, Mo, Mg, Ni, Nb, Pb, Pd, Pt, Rh, Re, Ru, Sb, Ta, Te, Ti, V, W, Zr, Zn, and PEDOT:PSS.

The thin-film transistor may be an organic field-effect thin-film transistor.

The thin-film transistor may be flexible.

Any one organic semiconductor of the first organic semiconductor, the second organic semiconductor, and the third organic semiconductor may be any one of an n-type organic semiconductor and a p-type organic semiconductor, and the remaining organic semiconductors may be the remaining one of the n-type organic semiconductor and the p-type organic semiconductor.

The n-type organic semiconductor may be at least one selected from among N2200 (poly{[N,N'-bis(2-octyldodecyl)-naphthalene-1,4,5,8-bis(dicarboximide)-2,6-diyl]-alt-5,5'-(2,2'-bithiophene)}), anthracene, tetracene, hexacene, quinolone, naphthyridine, quinazoline, anthradithiophene, fullerene, perylenedicarboximide, naphthalene diimide, oligo-thiophene, 6,13-bis(triisopropylsilylethynyl)pentacene, 5,11-bis(triethylsilylethynyl)anthradithiophene, 2,8-difluoro-5,11-bis(triethylsilylethynyl)anthradithiophene, PCBM, Cu-phthalocyanine, and Zn-phthalocyanine.

The p-type organic semiconductor may be at least one selected from among diF-TES-ADT (2,8-difluoro-5,11-bis(triethylsilylethynyl)anthradithiophene), pentacene, poly(3-hexylthiophene), poly(3-pentylthiophene), poly(3-butylthiophene), poly(benzo[1,2-b:4,5-b']dithiophene), PBDT2FBT-2EHO (poly(4,8-bis(2-ethylhexyloxy)benzo[1,2-b:4,5-b']dithiophene-alt-4,7-bis(4-2-ethylhexyl)-2-thienyl)-5,6-difluoro-2,1,3-benzothiadiazole), and PDPP3T (poly(diketopyrrolopyrrole-terthiophene)).

At least one selected from among the first insulating film, the second insulating film, and the third insulating film each independently may include at least one selected from among Parylene, polydimethylsiloxane (PDMS), Cytop (CTL-809M, Asahi Glass), PMMA (poly(methyl methacrylate)), PVP (poly(vinyl pyrrolidone)), PI (polyimide), and aluminum oxide ($Al_2O_3$).

The substrate may include at least one selected from among a metal oxide, a semiconductor, glass, and plastic.

At least one selected from among the first interlayer insulating film and the second interlayer insulating film each independently may include at least one selected from among Parylene, polydimethylsiloxane (PDMS), Cytop (CTL-809M, Asahi Glass), PMMA (poly(methyl methacrylate)), PVP (poly(vinyl pyrrolidone)), PI (polyimide), and aluminum oxide ($Al_2O_3$).

Another aspect of the present invention provides:

a static RAM core cell assembly, configured such that the 3D static RAM core cell described above is provided in a plural number in a plane.

Still another aspect of the present invention provides:

an electronic device, comprising the 3D static RAM core cell described above.

Yet another aspect of the present invention provides:

a method of manufacturing a 3D static RAM core cell having a vertically stacked structure, comprising: forming a first transistor layer including two thin-film transistors; forming a second transistor layer including two thin-film transistors on the first transistor layer; and forming a third transistor layer including two thin-film transistors on the second transistor layer, at least one electrode of the first transistor layer and at least one electrode of the second transistor layer being electrically connected to each other, and at least one electrode of the second transistor layer and at least one electrode of the third transistor layer being electrically connected to each other.

Advantageous Effects

According to the present invention, a 3D static RAM core cell having a vertically stacked structure is configured such that organic transistors of the same type are arranged in the same plane and are vertically stacked, thus omitting a complicated patterning process for forming organic transistors of different types upon fabrication of a memory element, and also reducing the area occupied by the memory element to thereby increase the degree of integration of semiconductor circuits.

DESCRIPTION OF DRAWINGS

The exemplary embodiments of the present invention will be more clearly understood from the following detailed description taken in conjunction with the accompanying drawings, in which:

FIG. 1 is a circuit diagram of a 6 T static RAM;

FIG. 2 shows the structure of a three-layer organic thin-film transistor as an example of static RAM having a stacked structure;

FIG. 3 shows a static RAM comprising one p-type layers and two n-type layer; and FIG. 4 shows a static RAM core cell assembly according to the present invention.

BEST MODE

Hereinafter, embodiments of the present invention are described in detail with reference to the appended drawings so as to be easily performed by a person having ordinary skill in the art, and the drawings are not to be construed as limiting the technical idea of the present invention.

However, the following description does not limit the present invention to specific embodiments, and moreover, descriptions of known techniques, even if they are pertinent to the present invention, are considered unnecessary and may be omitted insofar as they would make the characteristics of the invention unclear.

The terms herein are used to explain specific embodiments and are not intended to limit the present invention. Unless otherwise stated, the singular expression includes a plural expression. In this application, the terms "include" or "have" are used to designate the presence of features, numbers, steps, operations, elements, or combinations thereof described in the specification, and should be understood as not excluding the presence or additional possibility of one or more different features, numbers, steps, operations, elements, or combinations thereof.

As used herein, the terms "first", "second", etc. may be used to describe various elements, but these elements are not to be limited by these terms. These terms are only used to distinguish one element from another. For example, a "first" element may be termed a "second" element, and, similarly, a "second" element may be termed a "first" element, without departing from the scope of the present invention.

Further, it will be understood that when an element is referred to as being "formed" or "stacked" on another element, it can be formed or stacked so as to be directly attached to all surfaces or one surface of the other element, or intervening elements may be present therebetween.

FIG. 1 is a circuit diagram of a 6 T static RAM, FIG. 2 shows the structure of a three-layer organic thin-film transistor as an example of the static RAM having a stacked structure (p-type-n-type-p-type stacked structure), and FIG. 3 shows a static RAM comprising one p-type layers and two n-type layer, which are sequentially stacked.

Hereinafter, with reference to FIGS. 1 to 3, a detailed description will be given of the 3D static RAM core cell having a vertically stacked structure according to the present invention. Here, the following description is based on the static RAM of FIG. 3, configured such that one p-type layer and two n-type layers are sequentially stacked, which is merely set forth to illustrate, but is not to be construed as limiting the present invention, and the present invention will be merely defined by the claims, as will be described later.

According to the present invention, the 3D static RAM core cell having a vertically stacked structure may be configured such that a first transistor layer 100, a second transistor layer 200 and a third transistor layer 300 are sequentially stacked upwards. The transistor layers 100, 200, 300 each include a pair of two thin-film transistors in the same plane.

The first transistor layer 100 is configured such that a pair of n-type transistors is present in the same plane, and specifically includes two switching thin-film transistors M5, M6.

The two switching thin-film transistors M5, M6 each independently include a first electrode channel film 110, a first insulating film 120, and a first gate electrode 130, which are sequentially disposed upwards. Here, the first electrode channel film 110 may include a first drain electrode 112, a first source electrode 114 and a first organic semiconductor 116.

The second transistor layer 200 is configured such that a pair of n-type transistors is present in the same plane, and specifically includes two data-storage thin-film transistors M1, M3.

The two data-storage thin-film transistors M1, M3 each independently include a second electrode channel film 210, a second insulating film 220, and a second gate electrode 230, which are sequentially disposed upwards. Here, the second electrode channel film 210 may include a second drain electrode 212, a second source electrode 214 and a second organic semiconductor 216.

The third transistor layer 300 is configured such that a pair of p-type transistors is present in the same plane, and specifically includes two data-storage thin-film transistors M2, M4.

The two data-storage thin-film transistors M2, M4 each independently include a third electrode channel film 310, a third insulating film 320, and a third gate electrode 330, which are sequentially disposed downwards. Here, the third gate electrode 330 may be the second gate electrode 230, and the third electrode channel film 310 may include a third drain electrode 312, a third source electrode 314 and a third organic semiconductor 316.

The first transistor layer 100 and the second transistor layer 200 may further include a first interlayer insulating film 410 between the first gate electrode 130 and the second electrode channel film.

Also, a second interlayer insulating film 420 may be disposed between the second transistor layer 200 and the third transistor layer 300, and the second interlayer insulating film 420 may be the third insulating film 320, and thus the second interlayer insulating film 420 may simultaneously function as the third insulating film 320.

Furthermore, the second gate electrode 230 may be the third gate electrode 330, and the second gate electrode 230 or the third gate electrode 330 may be shared as the gate electrode for the second transistor layer 200 and the third transistor layer 300, and may thus simultaneously perform the function of the gate electrode, and either of the second gate electrode 230 and the third gate electrode 330 may be formed and thus used.

The two data-storage thin-film transistors M1, M3 included in the second transistor layer 200 and the two data-storage thin-film transistors M2, M4 included in the third transistor layer 300 may be connected to a power supply voltage Vdd or a ground voltage Vss to thus record and read data.

As for the electrical connection of the constituents, one switching thin-film transistor M5 of the first transistor layer 100 may be configured such that the first drain electrode 112 and the first source electrode 114, which are source and drain electrodes thereof, are connected to any one BL of a bit-line pair BL, $\overline{BL}$ and also such that the first gate electrode 130, which is the gate electrode thereof, is connected to a word line WL.

The remaining one switching thin-film transistor M6 of the first transistor layer 100 may be configured such that the first drain electrode 112 and the first source electrode 114, which are source and drain electrodes thereof, are connected to the remaining one $\overline{BL}$ of the bit-line pair BL, $\overline{BL}$ and also such that the first gate electrode 130, which is the gate electrode thereof, is connected to the word line WL.

The first transistor layer may be disposed on the substrate.

The substrate may be a metal oxide, a semiconductor, glass, plastic, etc.

The gate electrode, the source electrode and the drain electrode each independently may include Au, Al, Ag, Be, Bi, Co, Cu, Cr, Hf, In, Mn, Mo, Mg, Ni, Nb, Pb, Pd, Pt, Rh, Re, Ru, Sb, Ta, Te, Ti, V, W, Zr, Zn, PEDOT:PSS, and the like.

The vertical connection of the gate electrode, the source electrode and the drain electrode may be electrically realized through a conductive via hole.

The conductive via hole may be filled with a conductive material, which is used for the gate electrode or the source electrode.

The thin-film transistor may be flexible.

The third transistor layer 300 may include a p-type transistor, and the third organic semiconductor 316 may include a p-type organic semiconductor.

Specifically, the p-type organic semiconductor may include diF-TES-ADT (2,8-difluoro-5,11-bis(triethylsilylethynyl)anthradithiophene), pentacene, poly(3-hexylthiophene), poly(3-pentylthiophene), poly(3-butylthiophene), poly(benzo[1,2-b:4,5-b']dithiophene), PBDT2FBT-2EHO (poly(4,8-bis(2-ethylhexyloxy)benzo[1,2-b:4,5-b']dithiophene-alt-4,7-bis(4-2-ethylhexyl)-2-thienyl)-5,6-difluoro-2, 1,3-benzothiadiazole), and PDPP3T (poly(diketopyrrolopyrrole-terthiophene)), but the scope of the present invention is not limited thereto.

The first transistor layer 100 and the second transistor layer 200 include an n-type transistor, and thus the first organic semiconductor 116 and the second organic semiconductor 216 each may include an n-type organic semiconductor.

Specifically, the n-type organic semiconductor may include N2200 (poly{[N,N'-bis(2-octyldodecyl)-naphthalene-1,4,5,8-bis(dicarboximide)-2,6-diyl]-alt-5,5'-(2,2'-bithiophene)}), anthracene, tetracene, hexacene, quinolone, naphthyridine, quinazoline, anthradithiophene, fullerene, perylenedicarboximide, naphthalene diimide, oligo-thiophene, 6,13-bis(triisopropylsilylethynyl)pentacene, 5,11-bis(triethylsilylethynyl)anthradithiophene, 2,8-difluoro-5,11-bis(triethylsilylethynyl)anthradithiophene, PCBM, Cu-phthalocyanine, and Zn-phthalocyanine, but the scope of the present invention is not limited thereto.

The first insulating film 120, the second insulating film 220, the third insulating film 320, the first interlayer insulating film 410 and the second interlayer insulating film 420 may be formed of an insulating material, such as Parylene, polydimethylsiloxane (PDMS), Cytop (CTL-809M, Asahi Glass), PMMA (poly(methyl methacrylate)), PVP (poly(vinyl pyrrolidone)), PI (polyimide), and aluminum oxide ($Al_2O_3$), but the scope of the present invention is not limited thereto.

The present invention pertains to a static RAM core cell assembly, configured such that the 3D static RAM core cell having a vertically stacked structure is provided in a plural number in the plane.

For reference, the static RAM core cell assembly according to the present invention is illustrated in FIG. 4.

In addition, the present invention pertains to an electronic device including the 3D static RAM core cell having a vertically stacked structure.

The electronic device may be applied to a variety of smart-type electronic products, such as computers, wearable devices, etc. requiring a semiconductor memory element.

Below is a description of a method of manufacturing the 3D static RAM core cell having a vertically stacked structure according to the present invention.

Specifically, a first transistor layer 100 including two thin-film transistors is formed.

Next, a second transistor layer 200 including two thin-film transistors is formed on the first transistor layer 100.

Next, a third transistor layer 300 including two thin-film transistors is formed on the second transistor layer 200.

The interlayer electrical connection in accordance with the first bit line BL and the second bit line $\overline{BL}$ may be performed through a via hole.

BRIEF DESCRIPTION OF THE REFERENCE NUMERALS

WL: word line, BL: any one of bit-line pair BL and $\overline{BL}$
$\overline{BL}$: remaining one of bit-line pair BL and $\overline{BL}$
Vdd: power supply voltage, Vss: ground voltage
M1, M2, M3, M4: data-storage thin-film transistor
M5, M6: switching thin-film transistor
100: first transistor layer, 112: first drain electrode
114: first source electrode, 116: first organic semiconductor
120: first insulating film, 130: first gate electrode
200: second transistor layer, 122: second drain electrode
214: second source electrode, 216: second organic semiconductor
220: second insulating film, 230: second gate electrode
300: third transistor layer, 322: third drain electrode
314: third source electrode, 316: third organic semiconductor
320: third insulating film, 330: third gate electrode
410: first interlayer insulating film, 420: second interlayer insulating film

MODE FOR INVENTION

Examples

Example 1: Manufacture of 3D Static RAM Core Cell

Formation of First Transistor Layer 100 Including Two Thin-Film Transistors

Source and drain electrodes were applied on a substrate through printing with silver nanoparticle ink. Electrode conductivity was improved through thermal treatment and charge injection was improved through surface treatment. P-type ink (diF-TES-ADT) dissolved in mesitylene was applied between the source and drain electrodes using a printing process. A thermal treatment process was performed, and thus the solvent was evaporated and the properties of the organic material were improved. Parylene diX-SR was deposited thereon to thus form a dielectric layer. A gate electrode was printed thereon using silver nanoparticle ink.

Formation of Second Transistor Layer 200 Including Two Thin-Film Transistors on First Transistor Layer 100

Source and drain electrodes were applied on a substrate through printing with silver nanoparticle ink. Electrode conductivity was improved through thermal treatment and charge injection was improved through surface treatment. N-type ink N2200 [P(NDI2OD-T2)] dissolved in 1,2-dichlorobenzene was applied between the source and drain electrodes using a printing process. A thermal treatment process was performed, and thus the solvent was evaporated and the properties of the organic material were improved. Parylene diX-SR was thermally evaporated thereon to thus form a dielectric layer. A gate electrode was printed thereon using silver nanoparticle ink.

Formation of Third Transistor Layer 300 Including Two Thin-Film Transistors on Second Transistor Layer 200

A structure sharing a gate with the second layer was used. Parylene diX-SR was deposited on the shared gate to thus form a dielectric layer. Source and drain electrodes were applied on a substrate through printing with silver nanoparticle ink. Electrode conductivity was improved through thermal treatment, and charge injection was improved through surface treatment. P-type ink (diF-TES-ADT) dissolved in mesitylene was applied between the source and drain electrodes using a printing process. A thermal treatment process was performed, and thus the solvent was evaporated and the properties of the organic material were improved. Finally, a via hole was formed using a laser and then filled using a printing process, whereby electrodes were connected across the layers.

Example 2: Manufacture of Static RAM Core Cell Assembly Including 3D Static RAM Core Cells A static RAM core cell assembly was manufactured by arranging the 3D static RAM core cell of Example 1 in an array of 10 (rows)×10 (columns) (100). The cells in respective rows shared one word line, and the cells in respective columns shared two bit lines. Respective lines were formed by printing silver nanoparticle ink. The word line and the bit lines function to read and write data in respective cells.

Test Example 1: Memory Performance Test of 3D Static RAM Core Cell

The memory of the 3D static RAM core cell according to the present invention was confirmed to have a superior static noise margin (SNM) (about 70% of Vdd/2) based on the butterfly curve of a cross-coupled inverter.

The scope of the invention is represented by the claims below rather than the aforementioned detailed description, and all of the changes or modified forms that are capable of being derived from the meaning, range, and equivalent concepts of the appended claims should be construed as being included in the scope of the present invention.

INDUSTRIAL APPLICABILITY

According to the present invention, a 3D static RAM core cell having a vertically stacked structure is configured such that organic transistors of the same type are arranged in the same plane and are vertically stacked, thus omitting a complicated patterning process for forming organic transistors of different types upon fabrication of a memory element, and also reducing the area occupied by the memory element to thereby increase the degree of integration of semiconductor circuits.

The invention claimed is:

1. A method of manufacturing a 3D static RAM core cell having a vertically stacked structure containing thin-film transistors, consisting essentially of:
   (a) forming a first transistor layer including two of the thin-film transistors;
   (b) after forming the first transistor layer, forming a second transistor layer including two of the thin-film transistors on the first transistor layer; and
   (c) after forming the second transistor layer, forming a third transistor layer including two of the thin-film transistors on the second transistor layer,
   wherein the step (a) consists of:
   (a-1) forming a first source electrode and a first drain electrode on a substrate through printing;
   (a-2) forming a first electrode channel film comprising a first organic semiconductor between the first source electrode and the first drain electrode through printing;
   (a-3) forming a first insulating film on the first electrode channel film through deposition; and
   (a-4) forming a first gate electrode on the first insulating film through printing,
   wherein the first electrode channel film, the first insulating film, and the first gate electrode are sequentially disposed upwards,
   the step (b) consists of:
   (b-1) forming a second source electrode and a second drain electrode on the first transistor layer through printing;
   (b-2) forming a second electrode channel film comprising a second organic semiconductor between the second source electrode and the second drain electrode through printing;
   (b-3) forming a second insulating film on the second electrode channel film through deposition; and
   (b-4) forming a second gate electrode on the second insulating film through printing,
   wherein, the second electrode channel film, the second insulating film, and the second gate electrode are sequentially disposed upwards,
   the step (c) consists of:
   (c-1) forming a third insulating film on the second gate electrode through deposition;
   (c-2) forming a third source electrode and a third drain electrode on the third insulating film through printing; and
   (c-3) forming a third electrode channel film comprising a third organic semiconductor between the third source electrode and the third drain electrode through printing,
   wherein, the third electrode channel film and the third insulating film are sequentially disposed downwards, and
   at least one electrode of the first transistor layer and at least one electrode of the second transistor layer being electrically connected to each other, and at least one electrode of the second transistor layer and at least one electrode of the third transistor layer being electrically connected to each other.

2. The method of manufacturing a 3D static RAM core cell of claim 1,
   wherein two thin-film transistors among six thin-film transistors are any one of an n-type and a p-type, and the remaining four thin-film transistors among the six thin-film transistors are a remaining one of the n-type and the p-type, two thin-film transistors of the same type among the six thin-film transistors are included in any one transistor layer (a) among the first transistor layer to the third transistor layer, and two each of the remaining four thin-film transistors of the same type among the six thin-film transistors are included in remaining two transistor layers (b) among the first transistor layer to the third transistor layer.

3. The method of manufacturing a 3D static RAM core cell of claim 2,
   wherein electrical connection is performed through a conductive via hole.

4. The method of manufacturing a 3D static RAM core cell of claim 3,
   wherein the second transistor layer and the third transistor layer share the second gate electrode.

5. The method of manufacturing a 3D static RAM core cell of claim 1, wherein the first transistor layer includes the first electrode channel film comprising the first source electrode, the first drain electrode and the first organic semiconductor; the first insulating film formed on the first electrode channel film; and the first gate electrode formed on the first insulating film, the second transistor layer includes the second electrode channel film comprising the second source electrode, the second drain electrode and the second organic semiconductor; the second insulating film formed on the second electrode channel film; and the second gate electrode formed on the second insulating film, and the third transistor layer includes the third electrode channel film comprising the third source electrode, the third drain electrode and the third organic semiconductor; and the third insulating film formed on the third electrode channel film.

6. The method of manufacturing a 3D static RAM core cell of claim 5,
wherein the first transistor layer is disposed on the substrate.

7. The method of manufacturing a 3D static RAM core cell of claim 5,
wherein a first interlayer insulating film is further disposed on the first gate electrode, and a second interlayer insulating film is further disposed on the second gate electrode.

8. The method of manufacturing a 3D static RAM core cell of claim 1,
wherein at least one of the gate electrode and the source electrode each independently includes at least one selected from among Au, Al, Ag, Be, Bi, Co, Cu, Cr, Hf, In, Mn, Mo, Mg, Ni, Nb, Pb, Pd, Pt, Rh, Re, Ru, Sb, Ta, Te, Ti, V, W, Zr, Zn, and PEDOT:PSS.

9. The method of manufacturing a 3D static RAM core cell of claim 1,
wherein at least one of the thin-film transistors is an organic field-effect thin-film transistor.

10. The method of manufacturing a 3D static RAM core cell of claim 1,
wherein at least one of the thin-film transistors is flexible.

11. The method of manufacturing a 3D static RAM core cell of claim 5,
wherein any one organic semiconductor of the first organic semiconductor, the second organic semiconductor, and the third organic semiconductor is any one of an n-type organic semiconductor and a p-type organic semiconductor, and remaining organic semiconductors are a remaining one of the n-type organic semiconductor and the p-type organic semiconductor, the n-type organic semiconductor is at least one selected from among N2200 (poly{[N,N'-bis(2-octyldodecyl)-naphthalene-1,4,5,8-bis(dicarboximide)-2,6-diyl]-alt-5,5'-(2,2'-bithiophene)}), anthracene, tetracene, hexacene, quinolone, naphthyridine, quinazoline, anthradithiophene, fullerene, perylenedicarboximide, naphthalene diimide, oligo-thiophene, 6,13-bis(triisopropylsilylethynyl)pentacene, 5,11-bis(triethylsilylethynyl)anthradithiophene, 2,8-difluoro-5,11-bis(triethylsilylethynyl)anthradithiophene, PCBM, Cu-phthalocyanine, and Zn-phthalocyanine, and the p-type organic semiconductor is at least one selected from among diF-TES-ADT (2,8-difluoro-5,11-bis(triethylsilylethynyl)anthradithiophene), pentacene, poly(3-hexylthiophene), poly(3-pentylthiophene), poly(3-butylthiophene), poly(benzo[1,2-b:4,5-b']dithiophene), PBDT2FBT-2EHO (poly(4,8-bis(2-ethylhexyloxy)benzo[1,2-b:4,5-b']dithiophene-alt-4,7-bis(4-2-ethylhexyl)-2-thienyl)-5,6-difluoro-2,1,3-benzothiadiazole), and PDPP3T (poly(diketopyrrolopyrrole-terthiophene)).

12. The method of manufacturing a 3D static RAM core cell of claim 5,
wherein at least one selected from among the first insulating film, the second insulating film, and the third insulating film each independently includes at least one selected from among Parylene, polydimethylsiloxane (PDMS), Cytop (CTL-809M, Asahi Glass), PMMA (poly(methyl methacrylate)), PVP (poly(vinyl pyrrolidone)), and PI (polyimide).

13. The method of manufacturing a 3D static RAM core cell of claim 6,
wherein the substrate includes at least one selected from among a metal oxide, a semiconductor, glass, and plastic.

14. The method of manufacturing a 3D static RAM core cell of claim 7,
wherein at least one selected from among the first interlayer insulating film and the second interlayer insulating film each independently includes at least one selected from among Parylene, polydimethylsiloxane (PDMS), Cytop (CTL-809M, Asahi Glass), PMMA (poly(methyl methacrylate)), PVP (poly(vinyl pyrrolidone)), PI (polyimide), and aluminum oxide ($Al_2O_3$).

* * * * *